(12) United States Patent
Chiang

(10) Patent No.: US 7,590,928 B2
(45) Date of Patent: Sep. 15, 2009

(54) APPARATUS AND METHOD FOR VITERBI DECODING

(75) Inventor: Jung Tang Chiang, Hsinchu (TW)

(73) Assignee: Realtek Semiconductor Corp. (TW)

( * ) Notice: Subject to any disclaimer, the term of this patent is extended or adjusted under 35 U.S.C. 154(b) by 679 days.

(21) Appl. No.: 11/412,580

(22) Filed: Apr. 27, 2006

(65) Prior Publication Data

US 2006/0245526 A1    Nov. 2, 2006

(30) Foreign Application Priority Data

Apr. 29, 2005    (TW) ............................. 94114048 A

(51) Int. Cl.
*H03M 13/03* (2006.01)
(52) U.S. Cl. .................. 714/795; 714/792; 714/794; 714/796; 714/755; 714/786; 375/262; 375/341
(58) Field of Classification Search ................ 714/786, 714/755, 792, 794, 795, 796; 375/262, 341
See application file for complete search history.

(56) References Cited

U.S. PATENT DOCUMENTS 5,784,392 A * 7/1998 Czaja et al. ................. 714/786
7,085,992 B2 * 8/2006 Becker et al. ............... 714/795
2006/0242531 A1 * 10/2006 Hedayat et al. ............. 714/755

OTHER PUBLICATIONS

Feygin, Gennada and Gulak, P.G. in IEE Transactions on Communications, vol. 41, No. 3 Mar. 1993, Architectural Tradeoffs for Survivor Sequence Memory Management in Viterbi Decoders.

* cited by examiner

*Primary Examiner*—Guy J Lamarre

(57) ABSTRACT

A Viterbi decoding apparatus and a method thereof are disclosed. According to each partial surviving path formed by the decision information of every k continuous symbols of a symbol sequence, the apparatus can write its start trellis state and corresponding partial decoded information into a memory unit. On the other hand, the apparatus performs traceback reads and decode reads according to the content of the memory unit, thereby decoding a decoded information sequence corresponding to the symbol sequence. In this manner, memory space can be saved and the operating speed for traceback/decode reads need no acceleration. Thus, hardware cost and design complexity can be reduced simultaneously.

20 Claims, 6 Drawing Sheets

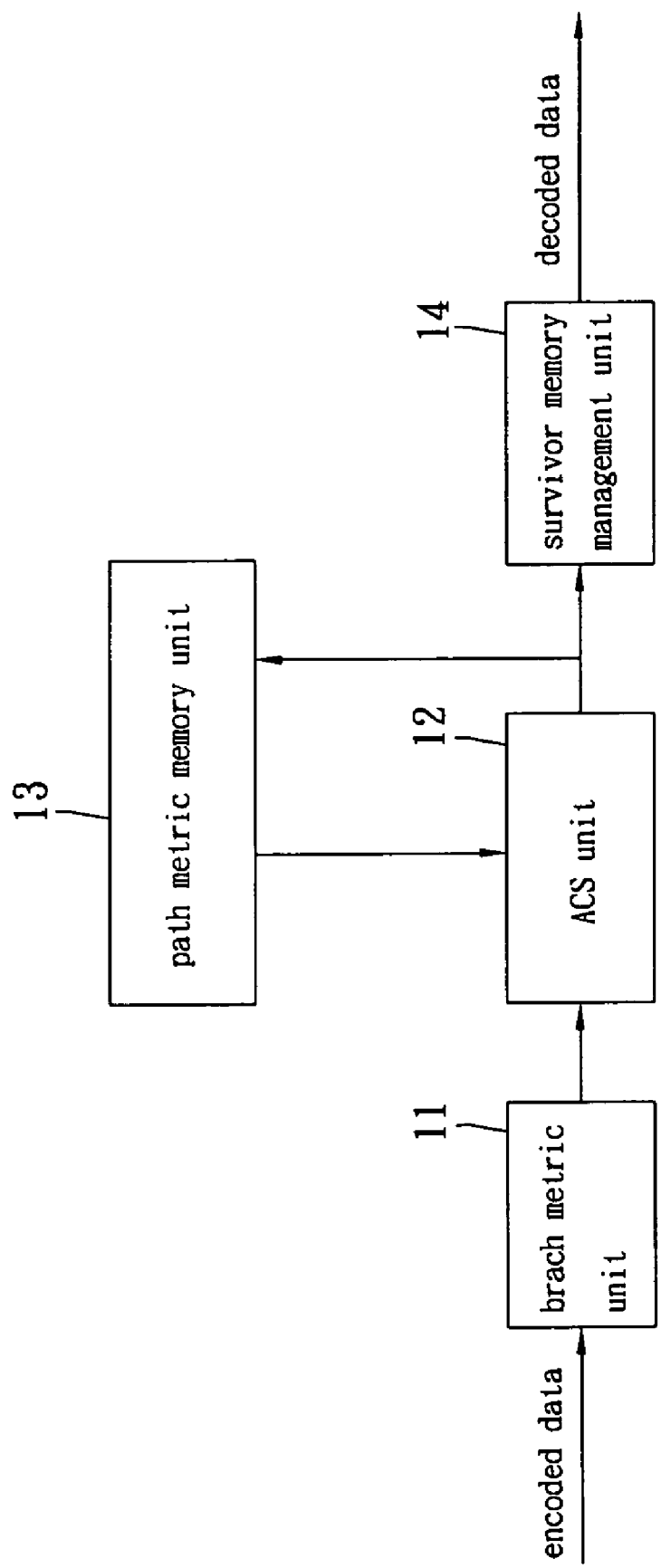
F I G. 1

APPARATUS AND METHOD FOR VITERBI DECODING

BACKGROUND OF THE INVENTION (a). Field of the Invention

The present invention relates to data decoding, and more particularly, to Viterbi decoding.

(b). Description of the Related Arts

Viterbi decoding is a common technique for decoding received convolutional-coded data. FIG. 1 is a diagram showing the architecture of a conventional Viterbi decoder. In FIG. 1, encoded data is provided to a branch metric unit 11 for computing all branch metrics for each node (or state) in a trellis diagram. Next, an add-compare-select (ACS) unit 12 accumulates the associated branch metric to each path metric, compares the path metrics of all the paths entering the same node, selects the path with the lowest path metric (i.e. the surviving path), and outputs a corresponding decision bit. Meanwhile, the ACS unit 12 stores each accumulated path metric back to a path metric memory unit 13. Lastly, a survivor memory management unit 14 determines a surviving path with maximum likelihood according to the decision bits outputted by the ACS unit 12, and outputs corresponding decoded data.

There are two approaches widely known in the art to implement the survivor memory management unit 14: register exchange approach and traceback approach. The register exchange approach directly stores the decoded data corresponding to each surviving path according to the decision bits; while the traceback approach records the path history of each surviving path used for performing tracing back, so as to generate the decoded data.

In the traceback approach, a two-dimensional memory is used to store the path history. The two-dimensional memory includes N rows (N being the number of the trellis-states), and the N decision bits generated during each symbol interval are stored into one column of the memory. According to the periodical article by G. Feygin and P. Gulak, "Architectural tradeoffs for survivor sequence memory management in Viterbi decoders", IEEE Transactions on Communications, vol. 41, issue 3, pp. 425-429, March 1993, three types of operations are performed in a traceback Viterbi decoder: Traceback Read, Decode Read, and Writing New Data. The three operations are performed simultaneously to read from and write into the two-dimensional memory. Said article suggests four algorithms for the traceback approach: k-pointer even algorithm, k-pointer odd algorithm, one-pointer algorithm, and hybrid algorithm. In k-pointer even algorithm, the required number of memory columns is $2kT/(k-1)$, where T represents the number of memory columns required to perform Traceback Read before Decode Read is performed. In k-pointer odd algorithm, the required number of memory columns is $T(2k-1)/(k-1)$. One-pointer algorithm is used to save memory space. However, since one-pointer algorithm uses a single read pointer and a single write pointer, the operating rate of Traceback Read or Decode Read is required to be k times of that of Writing New Data. That is, if Writing New Data operates in the rate of f MHz, then Traceback/Decode Read needs to operate in the rate of k×f MHz. This would cause design complexity and difficulty for a high data rate system. In addition, though hybrid algorithm combines the concepts of k-pointer (even or odd) algorithm and one-pointer algorithm, the restriction mentioned above still exists: in order to save memory space, the operating rate of Traceback/Decode Read increases.

SUMMARY OF THE INVENTION

It is therefore one objective of this invention to provide a Viterbi decoding apparatus and method which can save memory space without need to increase the operating rate of Traceback/Decode Read, thereby lowering hardware cost and design complexity simultaneously.

Another objective of this invention is to provide a memory management device for Viterbi decoding which applies the concepts of both the register exchange approach and the traceback approach, thereby achieving efficient survivor memory management.

According to one embodiment of this invention, a method for Viterbi decoding is provided. The method comprises steps of: generating a decision information corresponding to each trellis-state of a convolutional code according to each symbol of a symbol sequence encoded according to the convolutional code; generating a plurality of partial decoded informations corresponding to a plurality of partial surviving paths formed by the decision informations of each plurality of symbols of the symbol sequence; storing a start trellis-state and the corresponding partial decoded information of each of the partial surviving paths into a memory; performing a traceback according to the start trellis-states stored in the memory; and generating a decoded information sequence corresponding to the symbol sequence according to the start trellis-states and the partial decoded informations stored in the memory.

According to another embodiment of this invention, an apparatus for Viterbi decoding is provided. The apparatus comprises a decision information generating circuit and a memory management device. The decision information generating circuit is for generating a decision information corresponding to each trellis-state of a convolutional code according to each symbol of a symbol sequence encoded according to the convolutional code. The decision information records a previous trellis-state of the trellis-state corresponding to the decision information. The memory management device: a memory; a register module for generating a plurality of partial decoded informations corresponding to a plurality of partial surviving paths, and storing a start trellis-state and the corresponding partial decoded information of each of the partial surviving paths into the memory, wherein the partial surviving paths are formed according to decision informations of each plurality of symbols of a symbol sequence encoded according to a convolutional code; and a decoding circuit for performing a traceback according to the start trellis-states stored in the memory, and generating a decoded information sequence corresponding to the symbol sequence according to the start trellis-states and the partial decoded informations stored in the memory.

BRIEF DESCRIPTION OF THE DRAWINGS

FIG. 1 is a diagram showing the architecture of a conventional Viterbi decoder.

DETAILED DESCRIPTION OF THE INVENTION

Figure 2:
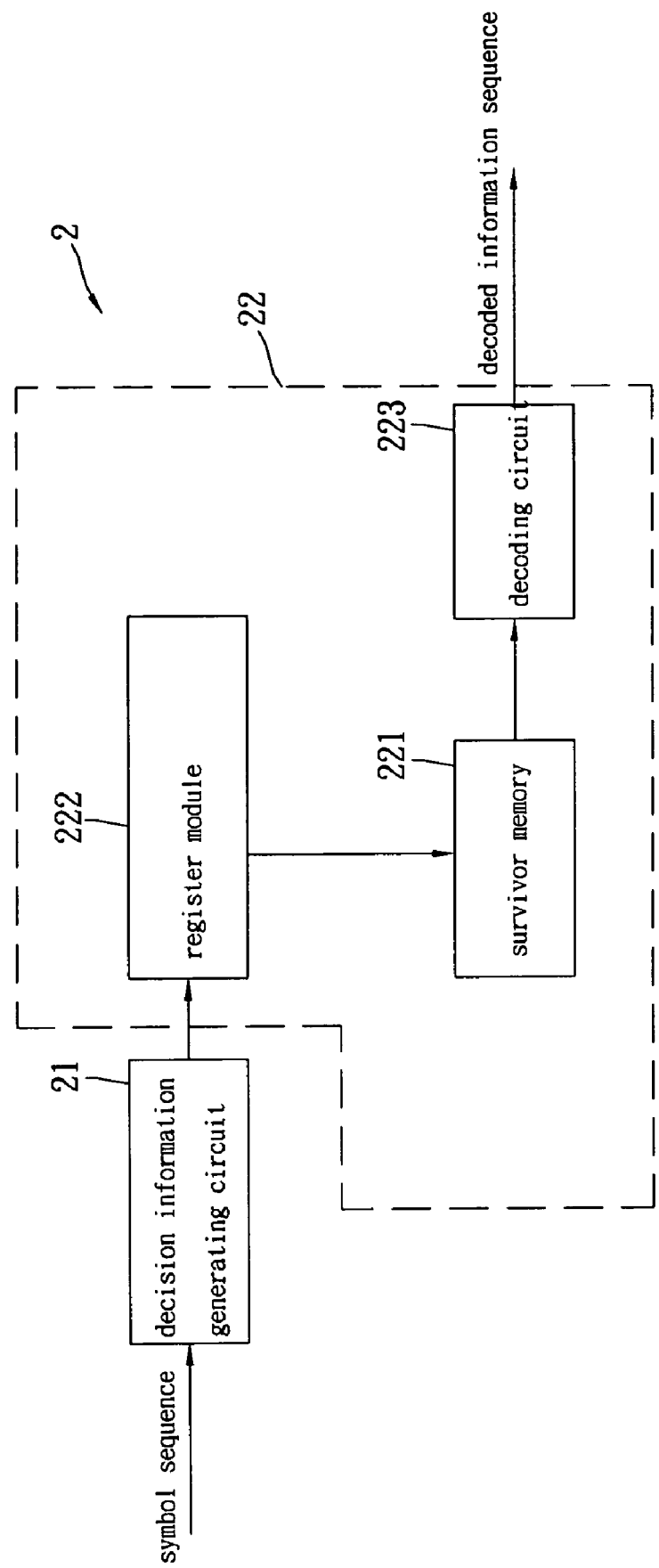
FIG. 2 is a block diagram of a preferred embodiment of the apparatus for Viterbi decoding according to the present invention.

FIG. 2 is a block diagram of a preferred embodiment of the apparatus for Viterbi decoding according to the present invention. The Viterbi decoding apparatus 2 in FIG. 2 is for decoding convolutional-coded data with a code rate of u/n and a memory order of m. In such a convolutional coding scheme, the number of trellis-states is N(=2$^m$), and each trellis-state is denoted by m×u bits. As shown in FIG. 2, the Viterbi decoding apparatus 2 includes a decision information generating circuit 21 and a memory management device 22. The decision information generating circuit 21 receives a symbol sequence encoded according to a convolutional coding algorithm, and generates decision information corresponding to each trellis-state according to each symbol of the received symbol sequence. Since the number of trellis-states is N, N decision informations would be generated for each symbol. Each decision information records a previous trellis-state of the corresponding trellis-state, i.e. which branch enters the corresponding trellis-state (i.e., the surviving branch).

The memory management device 22 generates a decoded information sequence corresponding to the received symbol sequence according to the decision informations provided by the decision information generating circuit 21. The memory management device 22 includes a survivor memory 221, a register module 222, and a decoding circuit 223. The register module 222 treats every k successive symbols as a group (k>m), receives the N decision informations of each symbol therein, and then forms a set of partial surviving paths according to the received decision informations. As mentioned above, the decision information records the surviving branch, so the partial surviving path can be gradually formed following the generation of the decision informations of the k successive symbols. The "partial" surviving path is so named because it is formed according to a portion (not the whole) of the symbol sequence. Since the number of trellis-states is N, N partial surviving paths would be formed. Each partial surviving path has a start trellis-state and an end trellis-state, and corresponds to a partial decoded information. It is notable that for two successive groups of k symbols, the start trellis-state of one partial surviving path for the latter group is the end trellis-state of a connected partial surviving path of the former group.

The register module 222 includes a first register and a second register for each of the N trellis-states. The register module 222 updates the first and second registers during the formation of the partial surviving paths. The first registers are updated in the manner as follows: when the register module 222 receives the decision informations for the first symbol of each group of k symbols (i.e., during the first symbol interval), the register module 222 stores a previous trellis-state into each first register according to the surviving branches recorded by the received decision informations. During the second to the k-th symbol intervals, the register module 222 shifts the content of the first registers according to the surviving branches generated during each symbol interval, such that each first register stores the content of the first register in the previous trellis-state. Thus, after k symbol intervals, the first register corresponding to the end trellis-state of each partial surviving path stores the start trellis-state, which is m×u-bit long, of that partial surviving path.

The second registers are updated in the manner as follows: during the first to (k−m)-th symbol intervals, the register module 222 shifts the content of the second registers according to the surviving branches generated during each symbol interval, so that each second register preserves the content of the second register from the previous state together with the decoded information (u bits) corresponding to the surviving branch. Then during the (k−m)-th to k-th symbol intervals, the register module 222 only shifts the content of the second registers according to the surviving branches generated during each symbol interval. Since the decoded information corresponding to the (k−m)-th to k-th symbols are the end trellis-state of the partial surviving path, these decoded information bits are not recorded to save the space of the second registers. Thus, after k symbol intervals, the second register corresponding to the end trellis-state of each partial surviving path stores the corresponding partial decoded information, each with a size of (k−m)×u decoded bits, of the partial surviving path.

After every k symbol intervals, the register module 222 writes the content of the first and second registers into the survivor memory 221, and the emptied space of the first and second registers can be used for a next group of k symbols. Therefore, each first register is required to store at least m×u bits, and each second register is required to store at least (k−m)×u bits. The survivor memory 221 is configured as a two-dimensional array with N rows, wherein each row corresponds to one trellis-state, and stores the content of the corresponding first and second registers.

The decoding circuit 223 performs the operations of Traceback Read and Decode Read according to the content of the survivor memory 221. The decoding circuit 223 first performs Traceback Read for a predetermined distance (i.e., the number of memory columns), and then performs Decode Read to generate a portion of the decoded information sequence. The above process is repeated until the whole decoded information sequence is generated. As mentioned above, the start trellis-state of any partial surviving path for a latter group of symbols is the end trellis-state of a connected partial surviving path of a former group of symbols. Thus, when performing Traceback Read, the decoding circuit 223 selects a maximum likelihood partial surviving path from a set of partial surviving paths, and, starting from the end trellis-state of the selected partial surviving path, reads in backward order the start trellis-state of each connected partial surviving path stored in the survivor memory 221, so as to perform traceback of the maximum likelihood surviving path. As to the operation of Decode Read, which is performed right after the operation Traceback Read, the decoding circuit 223 reads the start trellis-state of each connected partial surviving path from the survivor memory 221 to perform traceback, and also reads the corresponding partial decoded information of the connected partial surviving path stored in the survivor memory 221. By combining the start trellis-state and the partial decoded information, both read from the survivor memory 221, the decoding circuit 223 generates a portion of the decoded information sequence. This is because the corresponding decoded information of a group of k symbols can be generated by combining the corresponding partial decoded information and the end trellis-state of the maximum likelihood partial surviving path, where the latter is also the start trellis-state of the connected surviving path of a next group of k symbols.

In one embodiment, a circular buffer is used as the survivor memory 221 to save memory space. That is, the register module 222 writes the newly generated data into the memory space emptied after the decoding circuit 223 performs Decode Read.

In one embodiment, the decoding circuit 223 reads the survivor memory 221 by using a single read pointer for both Traceback Read and Decode Read. As mentioned earlier, by performing Traceback Read or Decode Read only once, the decoding circuit 223 can process the data being generated and written by the register module 222 during k symbol intervals. Thus, in this embodiment, if Traceback Read/Decode Read and Writing New Data both operate at the same operating rate, then the rate in which the decoding circuit 223 processes the data of the survivor memory 221 can substantially reach k times of the rate in which the register module 222 writes into the survivor memory 221 (here the rate is estimated in number of columns of the survivor memory 221). Thus, by using only two more sets of registers (i.e. the first and second registers, totaling N×k×u bits) than the conventional one-pointer algorithm, this embodiment can perform Viterbi decoding without need to accelerate the operating rate of Traceback Read or Decode Read.

Figure 3B:
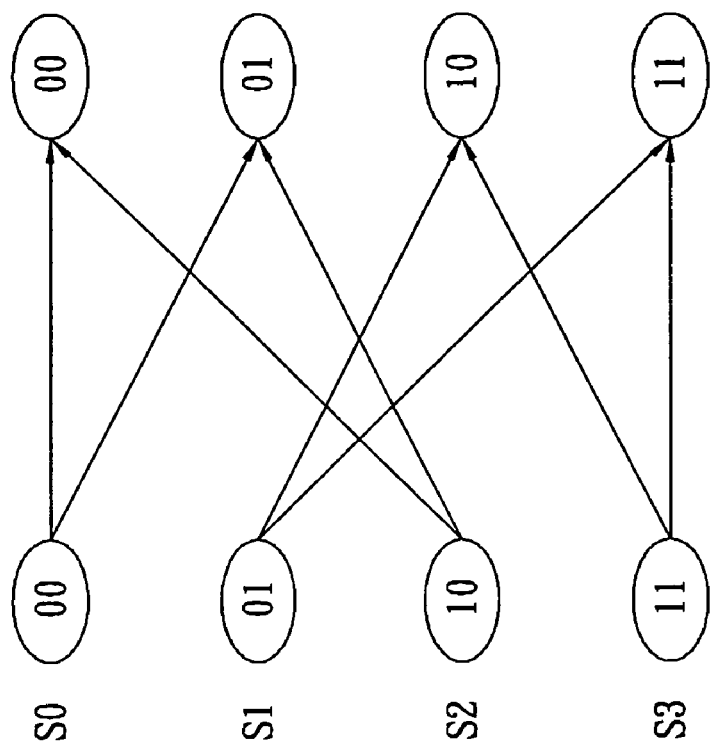
FIG. 3B is a trellis diagram for the encoder of FIG. 3A
Figure 3A:
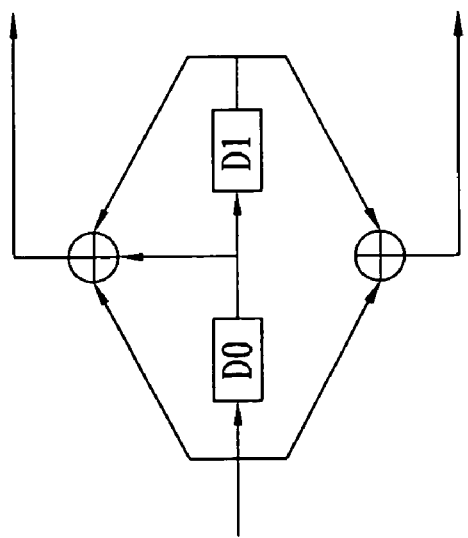
FIG. 3A is a diagram showing an encoder with a code rate 1/2 and a memory order m.
Figure 4:
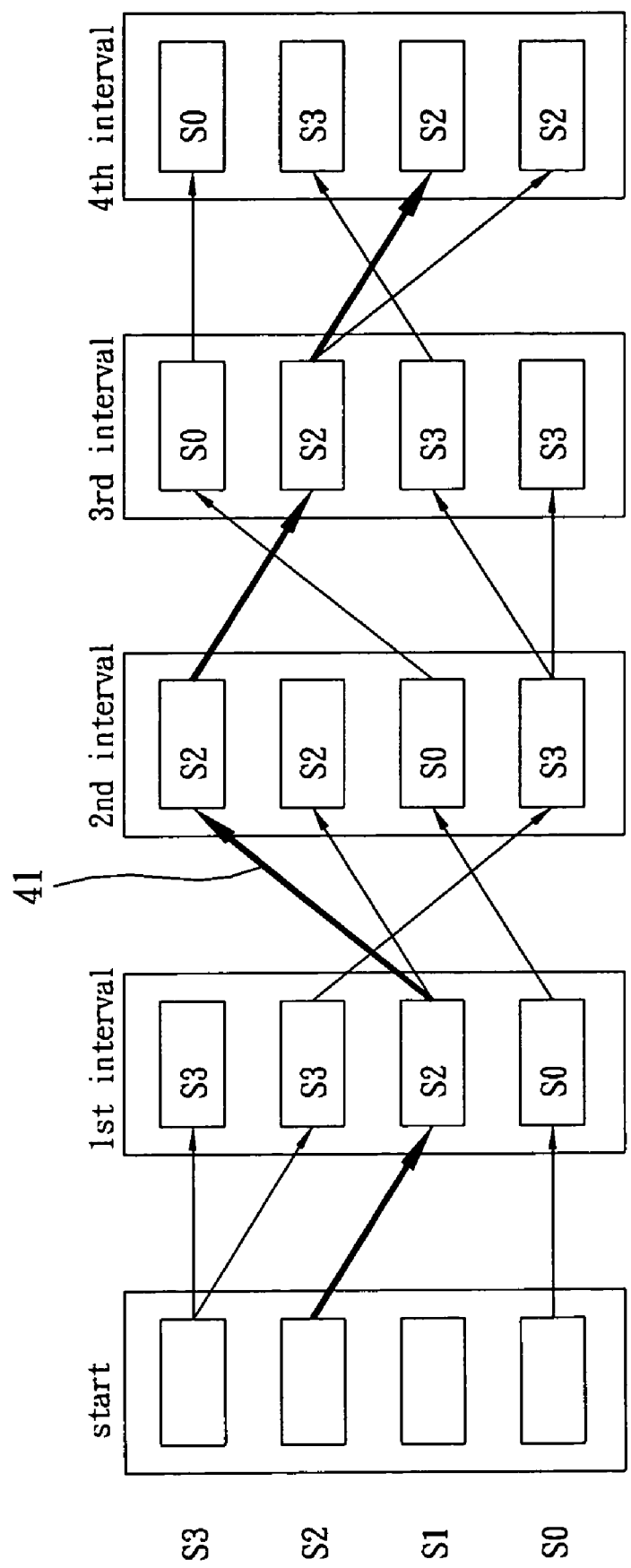
FIG. 4 is a diagram showing the process of updating the first registers.

In one embodiment, the code rate is set to 1/2, and k to 4. The operation of the register module 222 is described as follows. FIG. 3A is a diagram showing an encoder with a code rate 1/2 and a memory order m (=2), wherein D0 and D1 each stores one bit. FIG. 3B is a trellis diagram for the encoder of FIG. 3A, wherein S0, S1, S2, and S3 are trellis-states denoted as 00, 01, 10, and 11. FIG. 4 is a diagram showing the process of updating the first registers. In FIG. 4, each trellis-state has a corresponding first register. FIG. 4 illustrates an example of a 4-symbol group (i.e., k=4), and shows the surviving branches generated during each symbol interval. These surviving branches form four partial surviving paths. Take the partial surviving path 41 (denoted by bold lines) as an example. During the first symbol interval, the register module 222 stores the previous trellis-state S2 into the first register corresponding to S1 according to the surviving branch. Next, during the second to the fourth symbol intervals, the register module 222 subsequently shifts the stored S2 to the first registers corresponding to S3, S2, and S1. Lastly, the first register corresponding to the end trellis-state S1 of the partial surviving path 41 eventually stores the start trellis-state S2 of the partial surviving path 41. As to other three partial surviving paths, the register module 222 updates the related first registers in the same manner described above.

Figure 5:
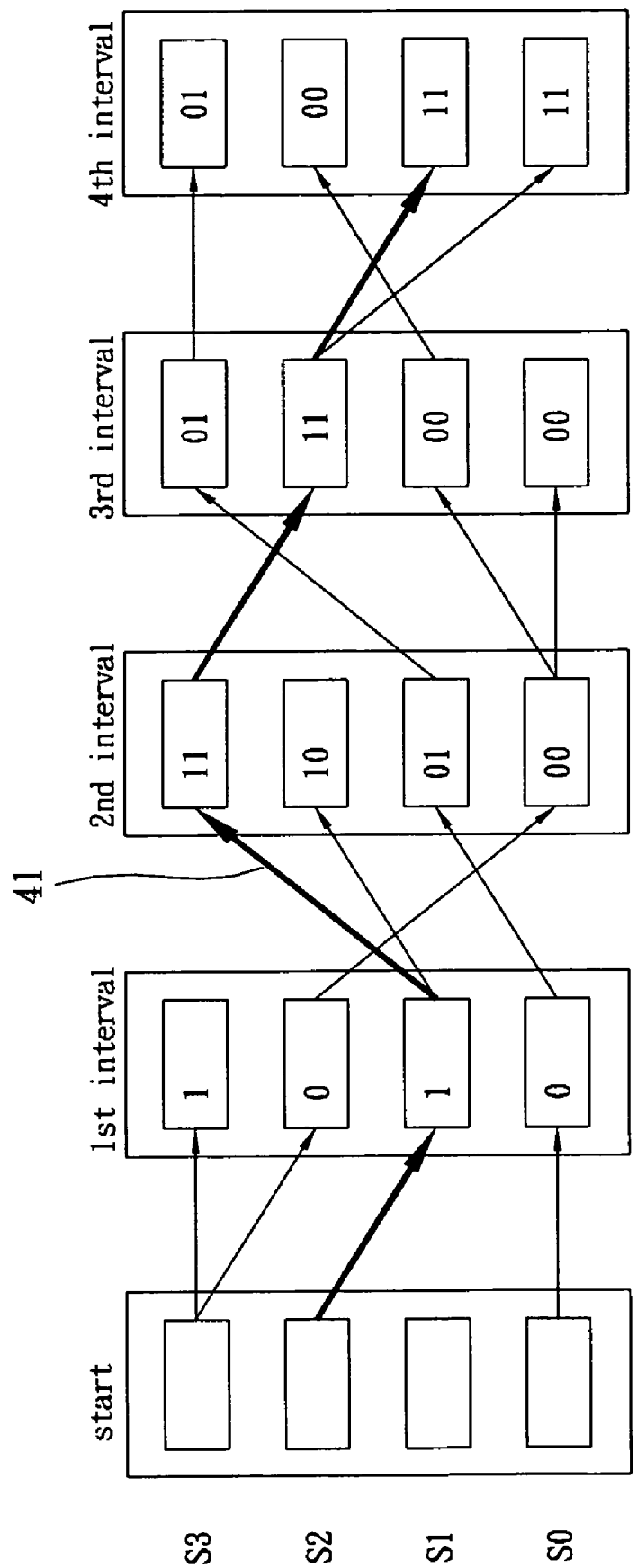
FIG. 5 is a diagram showing the process of updating the second registers.

FIG. 5 is a diagram showing the process of updating the second registers. In FIG. 5, each trellis-state has a corresponding second register, and the surviving branches and the partial surviving paths are the same as those in FIG. 4. Take the partial surviving path 41 (denoted by bold lines) as an example again. During the first symbol interval, the register module 222 stores a decoded bit 1 into the second register corresponding to S1 according to the related surviving branch; during the second symbol interval, according to the related surviving branch, the register module 222 shifts the content of the second register corresponding to S1 to the second register corresponding to S3 and adds with a decoded bit 1. Then, during the third and fourth symbol intervals, the register module 222 subsequently shifts the register content (i.e. the decoded bits 11) to the second registers corresponding to S2 and S1 according to the related surviving branches. Thus, the second register corresponding to the end trellis-state S1 of the partial surviving path 41 stores the corresponding partial decoded information (i.e. the decoded bits 11). As to other three partial surviving paths, the register module 222 updates the related second registers in the same manner described above.

Figure 6:
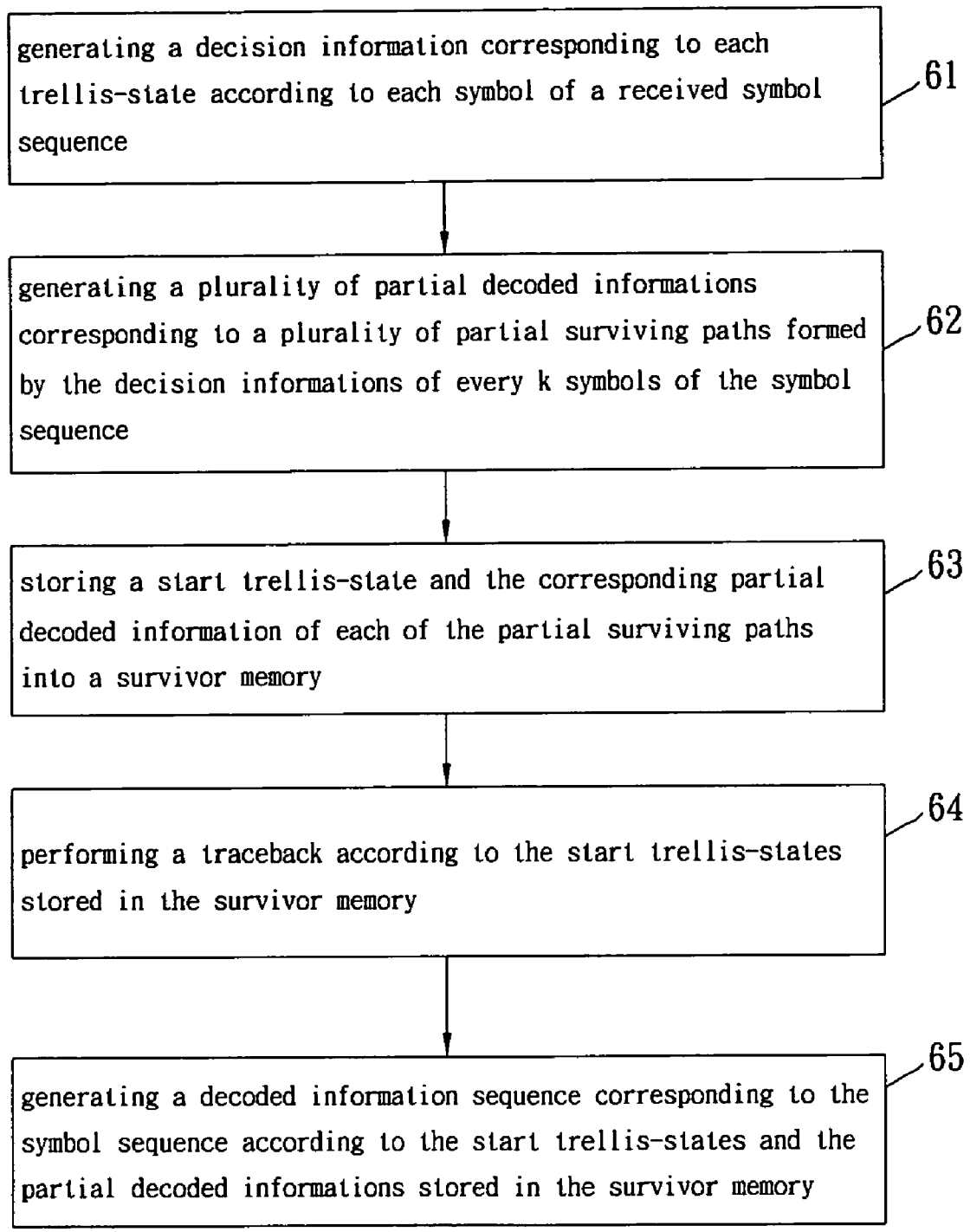
FIG. 6 is a flow chart of a preferred embodiment of the method for Viterbi decoding according to the present invention.

FIG. 6 is a flow chart of a preferred embodiment of the method for Viterbi decoding according to the present invention. The flow in FIG. 6 includes the following steps:

Step 61: generating a decision information corresponding to each trellis-state according to each symbol of a received symbol sequence;

Step 62: generating a plurality of partial decoded informations corresponding to a plurality of partial surviving paths formed by the decision informations of every k symbols of the symbol sequence;

Step 63: storing a start trellis-state and the corresponding partial decoded information of each of the partial surviving paths into a survivor memory 221;

Step 64: performing traceback according to the start trellis-states stored in the survivor memory 221; and Step 65: generating a decoded information sequence corresponding to the symbol sequence according to the start trellis-states and the partial decoded informations stored in the survivor memory 221.

The decision information records a previous trellis-state of the corresponding trellis-state. Step 63 is executed once for every k symbol intervals. In one embodiment, the survivor memory is a circular buffer. In another embodiment, step 64 and step 65 read the survivor memory by a single read pointer, and the operating rates of step 63 and step 65 are substantially equal.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. A method for Viterbi decoding comprising steps of:

generating a decision information corresponding to each trellis-state of a convolutional code according to each symbol of a symbol sequence encoded according to the convolutional code;

generating a plurality of partial decoded informations corresponding to a plurality of partial surviving paths formed by the decision informations of each plurality of symbols of the symbol sequence;

storing a start trellis-state and the corresponding partial decoded information of each of the partial surviving paths into a memory;

performing a traceback according to the start trellis-states stored in the memory; and generating a decoded information sequence corresponding to the symbol sequence according to the start trellis-states and the partial decoded informations stored in the memory.

2. The method of claim 1, wherein the memory is a circular buffer.

3. The method of claim 1, wherein the step of performing the traceback and the step of generating the decoded information sequence comprise reading the memory by a single read pointer.

4. The method of claim 1, wherein the step of performing the traceback and the step of generating the decoded information sequence comprise selecting a maximum likelihood one of the partial surviving paths.

5. The method of claim 1, wherein an operating rate of the storing step is substantially equal to that of the step of generating the decoded information sequence.

6. The method of claim 1, wherein the storing step is executed once for the each plurality of symbols of the symbol sequence.

7. An apparatus for Viterbi decoding comprising:
a memory;
a decision information generating circuit for generating a decision information corresponding to each trellis-state of a convolutional code according to each symbol of a symbol sequence encoded according to the convolutional code, wherein the decision information records a previous trellis-state of the trellis-state corresponding to the decision information;
a register module, coupled to the decision information generating circuit, for generating a plurality of partial decoded informations corresponding to a plurality of partial surviving paths formed by the decision informations of each plurality of symbols of the symbol sequence, and storing a start trellis-state and the corresponding partial decoded information of each of the partial surviving paths into the memory; and
a decoding circuit for performing a traceback according to the start trellis-states stored in the memory, and generating a decoded information sequence corresponding to the symbol sequence according to the start trellis-states and the partial decoded informations stored in the memory.

8. The apparatus of claim 7, wherein the memory is a circular buffer.

9. The apparatus of claim 7, wherein the decoding circuit reads the memory by a single read pointer.

10. The apparatus of claim 7, wherein an operating rate of the register module is substantially equal to that of the decoding circuit.

11. The apparatus of claim 7, wherein the register module comprises a first register and a second register corresponding to the each trellis-state.

12. The apparatus of claim 11, wherein the register module updates the first and second registers according to the formed partial surviving paths, wherein the first and second registers corresponding to an end trellis-state of each surviving path respectively stores the start trellis-state and the corresponding partial decoded information of the partial surviving path.

13. The apparatus of claim 11, wherein the register module stores content of the first and second registers into the memory for the each plurality of symbols of the symbol sequence.

14. A memory management device for Viterbi decoding comprising:
a memory;
a register module for generating a plurality of partial decoded informations corresponding to a plurality of partial surviving paths, and storing a start trellis-state and the corresponding partial decoded information of each of the partial surviving paths into the memory, wherein the partial surviving paths are formed according to decision informations of each plurality of symbols of a symbol sequence encoded according to a convolutional code; and
a decoding circuit for performing a traceback according to the start trellis-states stored in the memory, and generating a decoded information sequence corresponding to the symbol sequence according to the start trellis-states and the partial decoded informations stored in the memory.

15. The memory management device of claim 14, wherein the memory is a circular buffer.

16. The memory management device of claim 14, wherein the decoding circuit reads the memory by a single read pointer.

17. The memory management device of claim 14, wherein an operating rate of the register module is substantially equal to that of the decoding circuit.

18. The memory management device of claim 14 wherein the register module comprises a first register and a second register corresponding to each trellis-state of the convolutional code.

19. The memory management device of claim 18, wherein the register module updates the first and second registers according to the formed partial surviving paths, wherein the first and second registers corresponding to an end trellis-state of each surviving path respectively stores the start trellis-state and the corresponding partial decoded information of the partial surviving path.

20. The memory management device of claim 19, wherein the register module stores content of the first and second registers into the memory for the each plurality of symbols of the symbol sequence.

* * * * *